(12) United States Patent
Slaby et al.

(10) Patent No.: US 9,545,034 B2
(45) Date of Patent: Jan. 10, 2017

(54) DATA CENTER CANOPY INCLUDING TURNING VANES

(71) Applicant: Hewlett-Packard Development Company, L.P., Houston, TX (US)

(72) Inventors: Matthew Richard Slaby, Houston, TX (US); Felipe Visbal, Aguadilla, PR (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/797,708

(22) Filed: Jul. 13, 2015

(65) Prior Publication Data

US 2016/0100507 A1    Apr. 7, 2016

Related U.S. Application Data

(63) Continuation of application No. 13/754,761, filed on Jan. 30, 2013, now Pat. No. 9,101,081.

(51) Int. Cl.
*H05K 7/20* (2006.01)
*F24F 7/08* (2006.01)

(52) U.S. Cl.
CPC ............ *H05K 7/20745* (2013.01); *F24F 7/08* (2013.01); *H05K 7/20181* (2013.01)

(58) Field of Classification Search
CPC .. H05K 7/20745; H05K 7/20181; H05K 7/20; H05K 7/20145; H05K 7/20709; F24F 7/08; G06F 1/20
USPC .... 361/679.46, 688–723; 454/268, 278, 279, 454/281, 282, 299, 308, 312, 314, 318, 454/319, 320, 339; 165/69, 80.1, 80.2, 165/80.3, 182

See application file for complete search history.

(56) References Cited

U.S. PATENT DOCUMENTS

| | | | |
|---|---|---|---|
| 4,093,040 A * | 6/1978 | Treiber | F01N 1/10 181/252 |
| 8,184,435 B2 | 5/2012 | Bean et al. | |
| 2007/0281639 A1 * | 12/2007 | Clidaras | G06F 1/20 455/128 |
| 2010/0252231 A1 | 10/2010 | Tozer et al. | |
| 2011/0108207 A1 | 5/2011 | Mainers et al. | |
| 2011/0244783 A1 * | 10/2011 | Tollar | F24F 7/025 454/339 |
| 2012/0000986 A1 | 1/2012 | Jeong et al. | |
| 2012/0063893 A1 | 3/2012 | Pruthi et al. | |
| 2013/0040547 A1 * | 2/2013 | Moore | H05K 7/20745 454/184 |
| 2013/0174597 A1 * | 7/2013 | Cader | F24F 13/04 62/324.1 |

(Continued)

OTHER PUBLICATIONS

Jones, P. "Cooling the Cloud", www.datacenterdynamics.com/nl/focus/archive/2012/05/cooling-cloud, dated May 31, 2012, 3 pages.

*Primary Examiner* — Anthony Haughton
*Assistant Examiner* — Yahya Ahmad
(74) *Attorney, Agent, or Firm* — Hewlett Packard Enterprise Patent Department

(57) ABSTRACT

Examples provide data center canopies, data center housings, and data centers including turning vanes to facilitate air flow. In some examples, a data center canopy may include turning vanes to direct portions of an exhaust flow from an exhaust inlet toward floor sections to be output via exhaust outlets opposite the floor sections. Other examples are described and claimed.

14 Claims, 8 Drawing Sheets

(56) References Cited

U.S. PATENT DOCUMENTS

2014/0038510 A1* 2/2014 Bailey ................ H05K 7/20745
  454/339
2014/0059945 A1* 3/2014 Gardner ............... H05K 7/1497
  52/64
2015/0093985 A1* 4/2015 Towner .................. F24F 13/20
  454/363

* cited by examiner

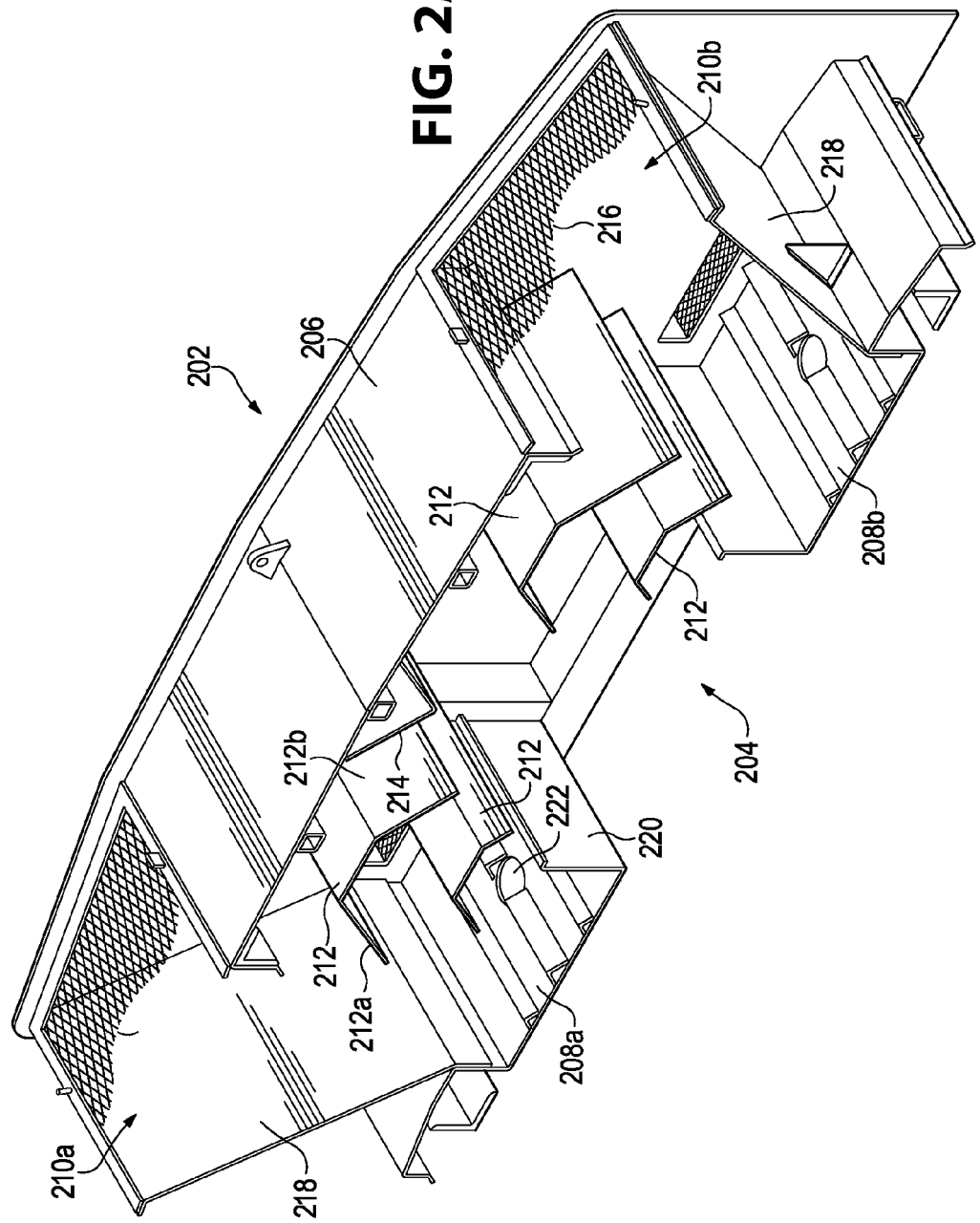

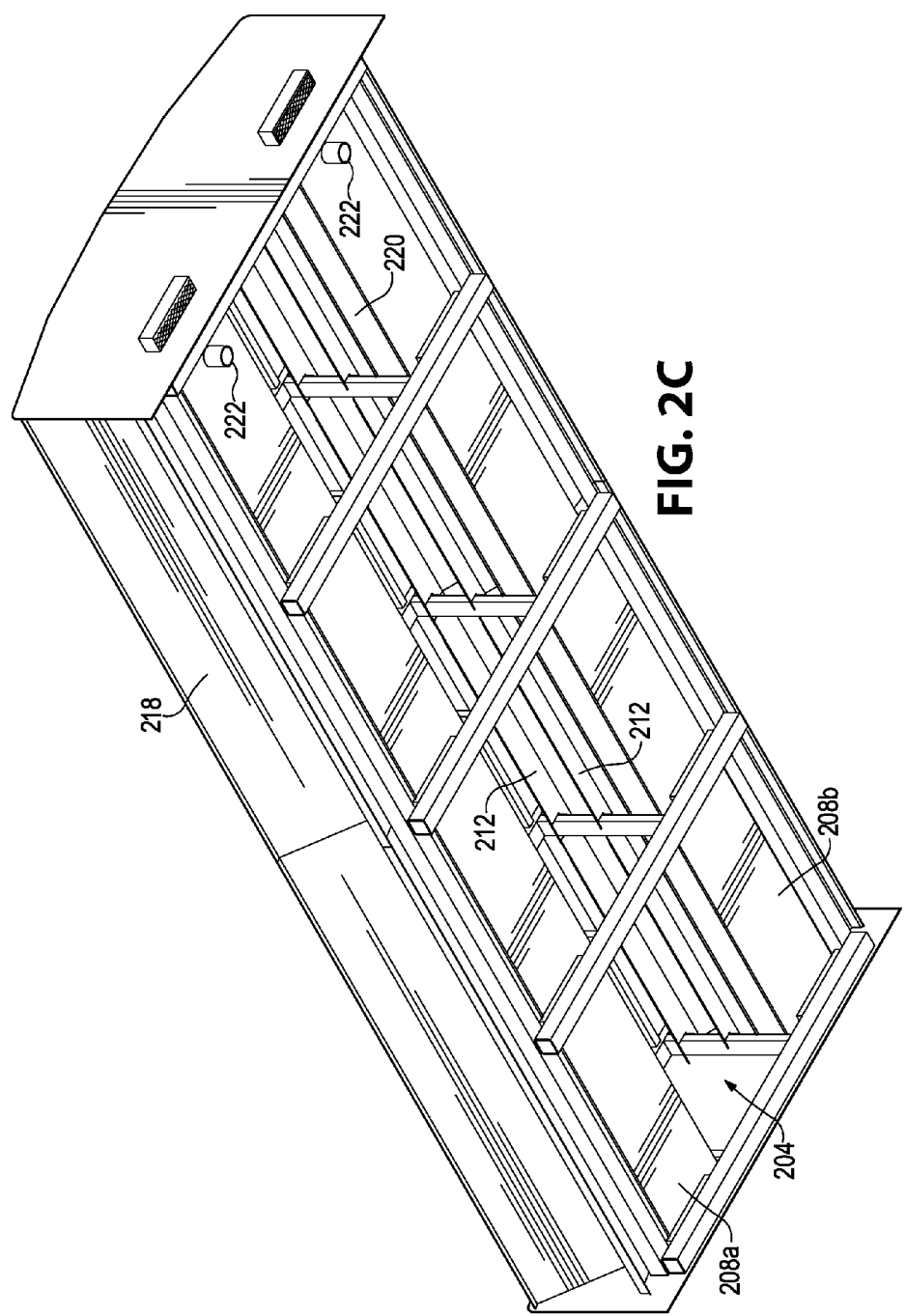

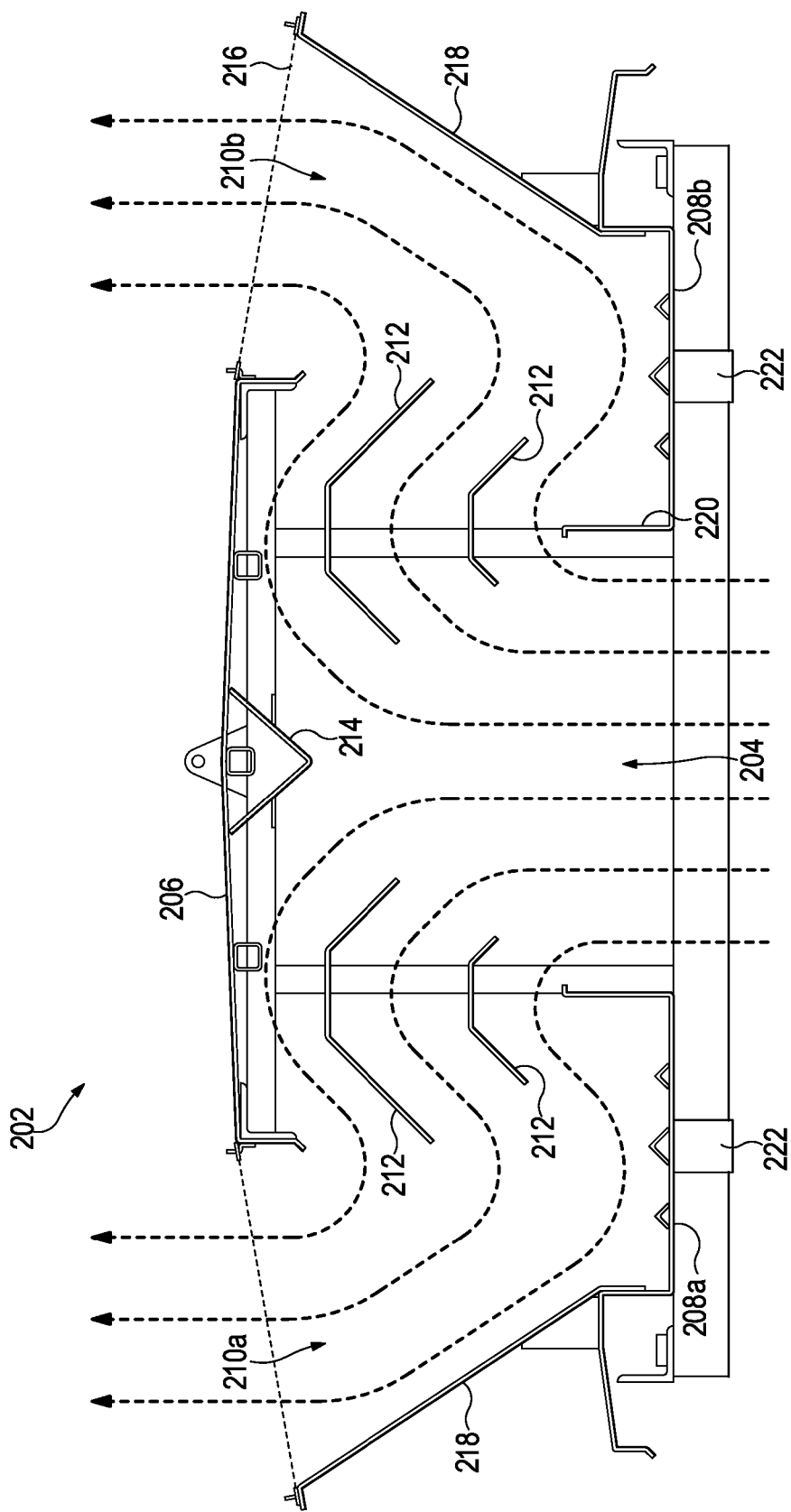

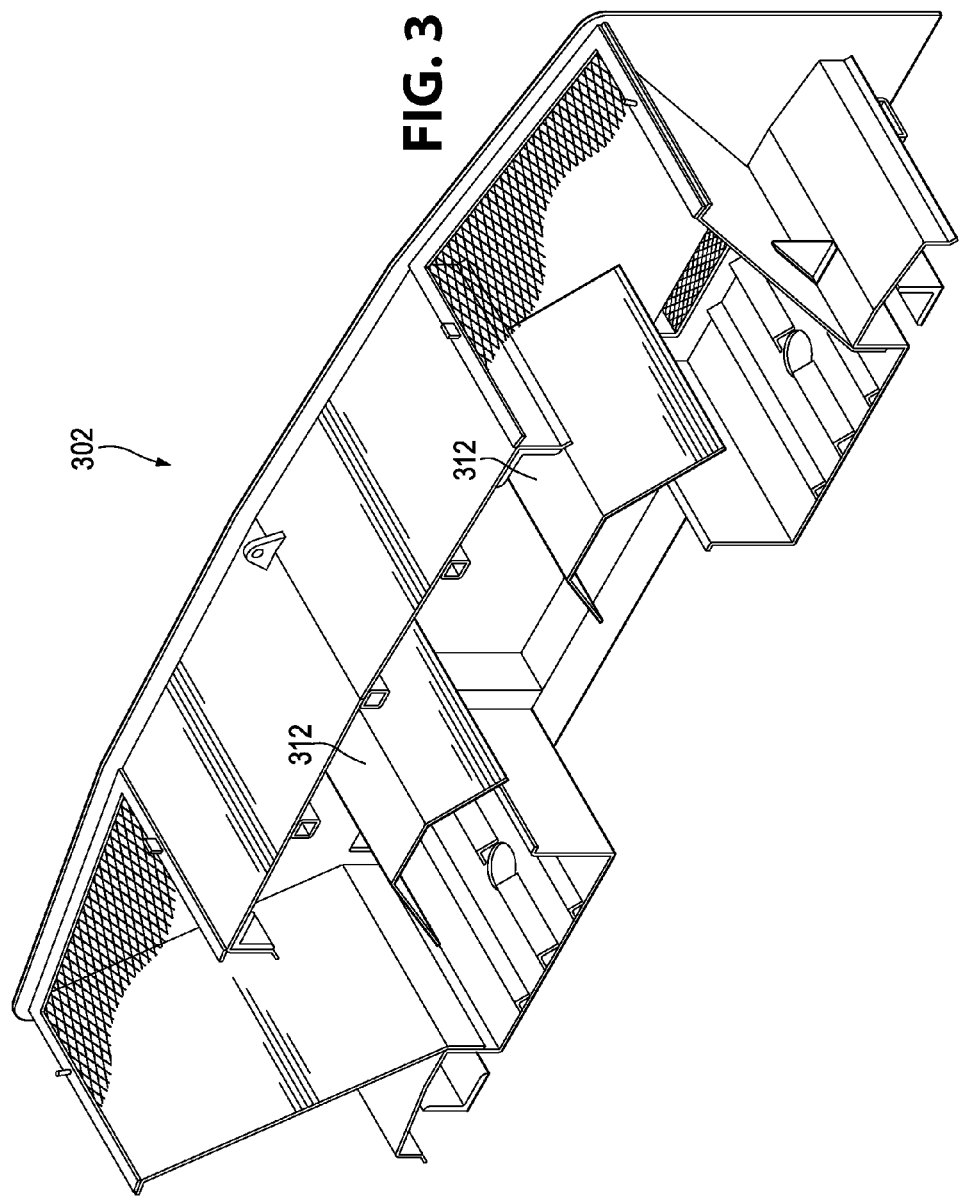

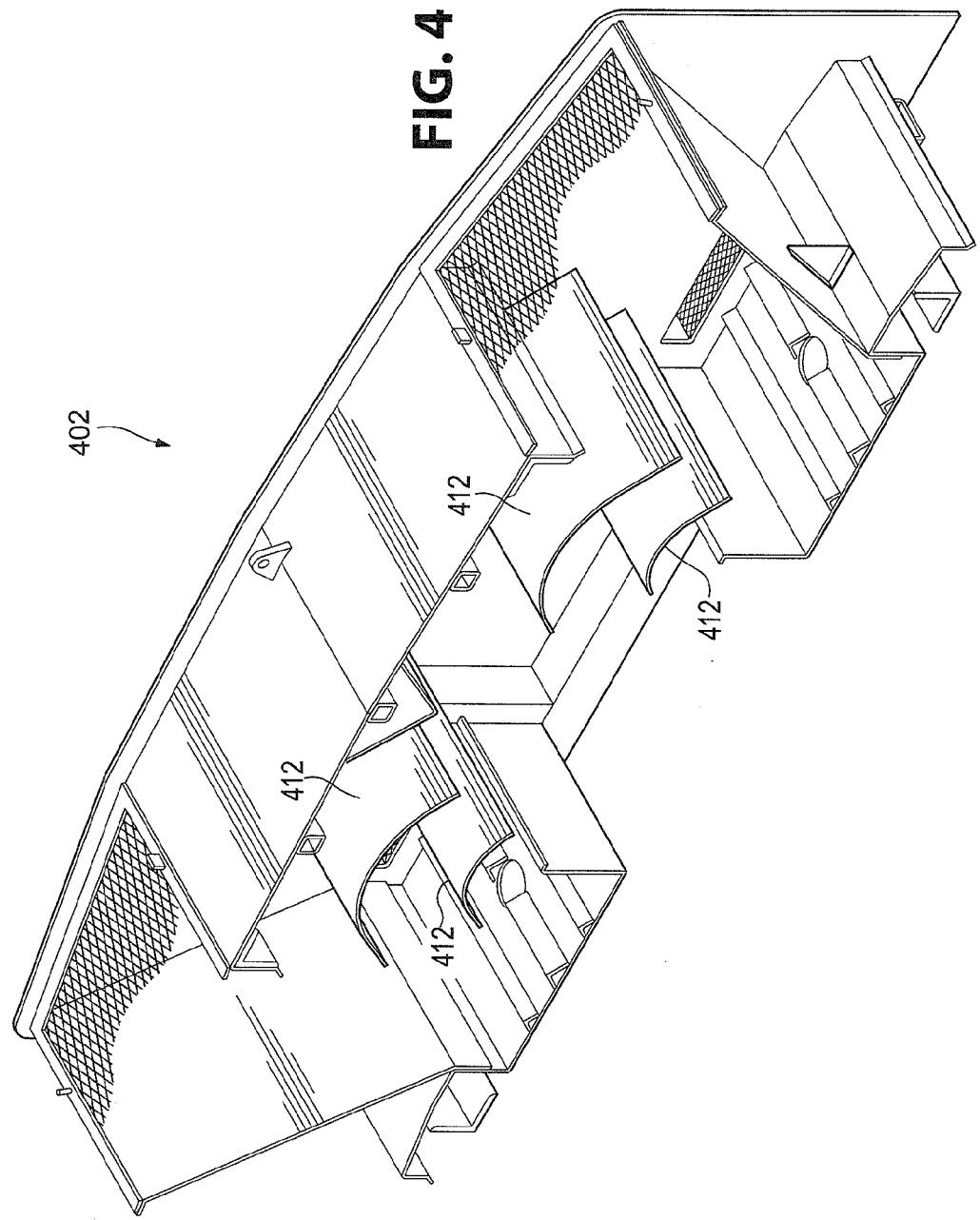

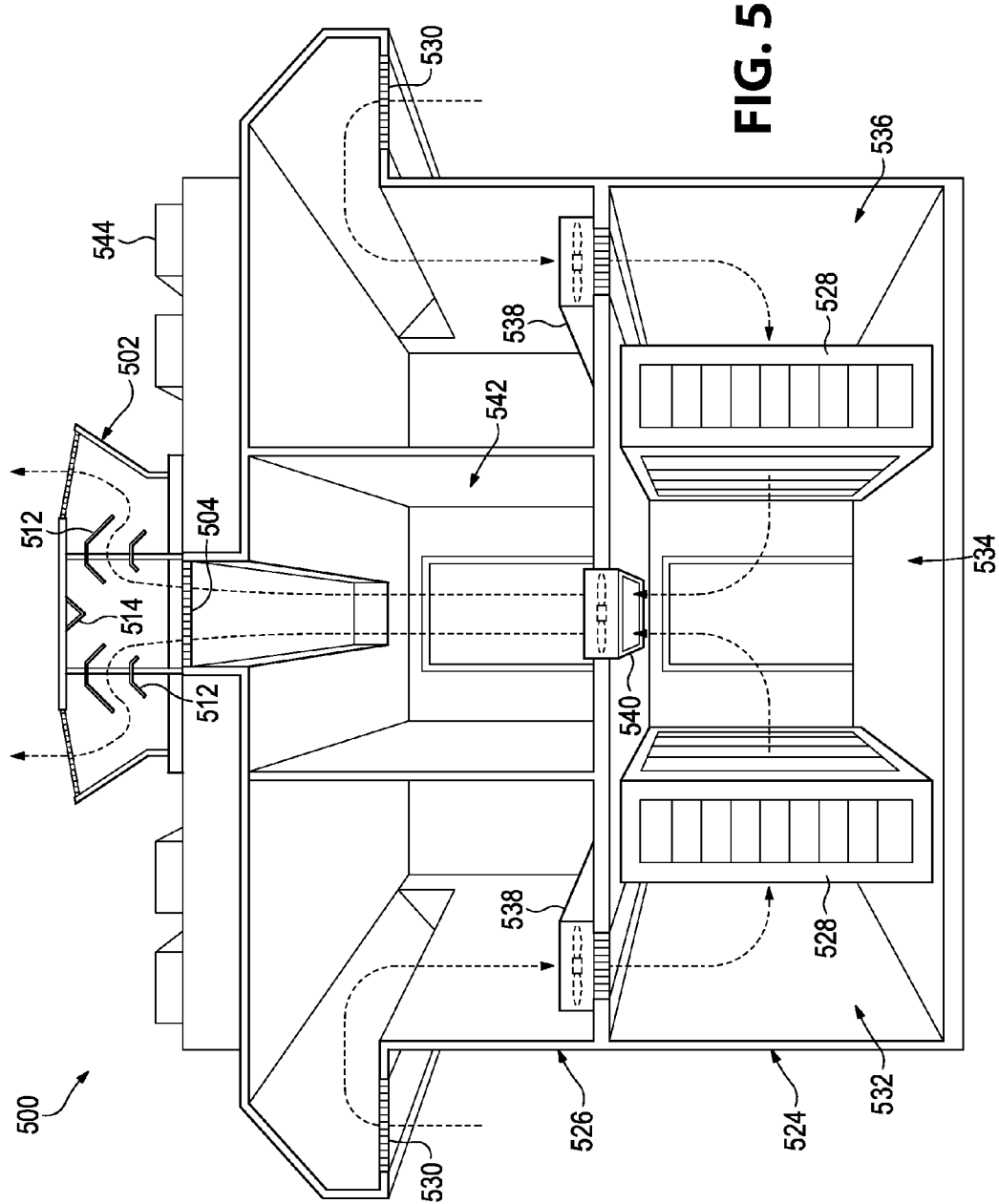

DATA CENTER CANOPY INCLUDING TURNING VANES

PRIORITY APPLICATION INFORMATION

This application is a continuation of U.S. application Ser. No. 13/754,761 filed Jan. 30, 2013, the contents of which are incorporated herein by reference.

BACKGROUND

Data centers typically include some form of cooling system for removing heat generated by the computers enclosed within the data center. Some data centers may be configured with a "free cooling" or "economizer" mode in which the data center is cooled using ambient air. In this mode, the data center may move the ambient air through the data center to cool the computers and then expel the exhausted air from the data center.

BRIEF DESCRIPTION OF THE DRAWINGS

Examples of the present disclosure will be described by way of example examples, but not limitations, illustrated in the accompanying drawings in which like references denote similar elements, and in which:

FIGS. 2A-2D are various views of another data center canopy, in accordance with various examples;

FIG. 3 is a view of another data center canopy, in accordance with various examples;

FIG. 4 is a view of another data center canopy, in accordance with various examples; and FIG. 5 is a view of a data center including a data center canopy, in accordance with various examples.

DETAILED DESCRIPTION OF EMBODIMENTS

Figure 1:
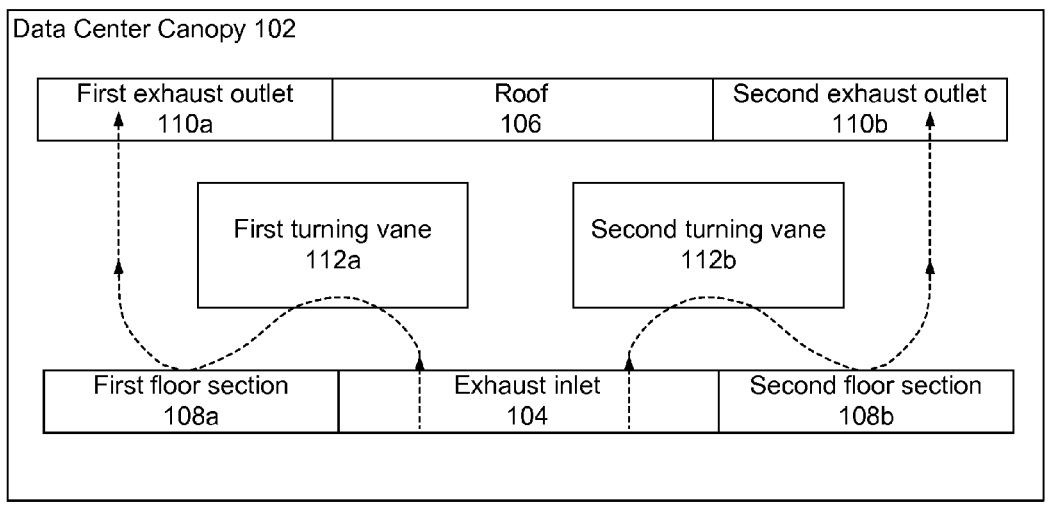
FIG. 1 is a block diagram of a data center canopy, in accordance with various examples.

Examples of the present disclosure provide data center canopies, data center housings, and data centers including turning vanes to facilitate air flow. Other examples are described and claimed.

Various aspects of the illustrative examples are described using terms commonly employed by those skilled in the art to convey the substance of their work to others skilled in the art. It will be apparent to those skilled in the art that alternate examples may be practiced with only some of the described aspects. For purposes of explanation, specific numbers, materials, and configurations are set forth in order to provide a thorough understanding of the illustrative examples. It will be apparent to one skilled in the art that alternate examples may be practiced without the specific details. In other instances, well-known features are omitted or simplified in order not to obscure the illustrative examples.

The phrases "in various examples" and "in some examples" are used repeatedly. The phrases generally do not refer to the same examples; however, they may. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B". The phrase "at least one of A, B and C" means (A), (B), (C), (A and B), (A and C), (B and C) or (A, B and C). The phrase "(A) B" means (B) or (A and B), that is, A is optional.

Data center cooling systems may operate in at least cooling modes. In the "free cooling" or "economizer" mode (hereinafter, "economizer mode"), the data center may be cooled using ambient air, which may optionally be mixed with warmer air to achieve a particular temperature set point. In the economizer mode, the ambient air flows into an air intake of the data center, flows into a cold aisle of the data center to cool the computers, and then is expelled from a hot aisle via an exhaust outlet at a velocity sufficient to flow away from the data center rather than flowing directly back into the ambient air intake.

The cooling capacity of a data center running in the economizer mode may be impacted by various factors. A data center with tight clearances, such as may be the case for containerized/modularized data centers, for example, may have a limited air flow rate as compared to a brick-and-mortar data center with larger clearances. Limited air flow may result in device failure due to inadequate cooling and/or may result in potential hot air recirculation back into the data center. To lower the pressure drop of the data center and increase the air flow rate for a data center, the number of computers (e.g., servers, etc.) could be reduced, but this option may run counter to the desire for higher density data centers. Blower speeds may be increased, but increased blower speeds may result in greater blower power consumption.

Another potential source of limited air flow in a data center may be air flow impedance at the point of exhaust. Some data centers, for example, may include a canopy via which exhaust may be expelled from the data center, but in some instances, the canopy itself may impede air flow, driving up the pressure drop, particularly if the canopy has a limited clearance gap. In addition, at least one component of the canopy, such as the canopy roof, may be situated so as to receive a direct force of the exhaust flow as the exhaust flow enters the canopy, which may necessitate the canopy roof being constructed in a manner and/or of a material to withstand the force of the air flow. As noted above, blower speeds may be increased to increase air flow, but increased blower speeds may result in an increased force against the canopy roof. Though increasing the clearance gaps of the canopy may help increase air flow, the increased clearance gaps, however, may result in intrusion of precipitation into the data center.

To facilitate data center cooling, some data centers include an increased number of hot aisles. These data centers direct the warm air from the multiple hot aisles to a common open space, and then exhaust the warmed air vertically via a Y-duct, in which rain is captured in the center of the Y. Additional hot aisles, however, may result in a larger footprint, which may result in increased cost or may be an undesirable option for compact and dense containerized data centers for which a compact footprint is a goal. Other data centers may include an air-to-air heat exchanger that isolates the internal data center environment from the external ambient, and instead, blows warmed air over a heat exchanger to remove heat from a hot aisle. In addition to increased cost, however, the heat exchanger may add thermal resistance to the heat path, limiting the overall thermal capacity of the data center.

Described herein are various examples of a data center canopy for improving air flow through the canopy. Various examples of data center housings and data centers configured for improved air flow are also described. To improve air flow, a data center canopy may include turning vanes to direct an exhaust flow from an exhaust inlet away from the canopy roof and generally toward the canopy floor to be output via an exhaust outlet. The turning vanes may inhibit entry of precipitation into the exhaust inlet. In various examples, the canopy may include a flow splitter to facilitate directing the exhaust flow away from the canopy roof.

FIG. 1 is a block diagram of an example data center canopy 102 in accordance with various examples. The data center canopy 102 may provide an exhaust passage for an exhaust flow from a data center. The canopy 102 may be mounted, for example, on a data center structure or may instead be an integrated part of the data center structure, to receive and then output an exhaust flow from a hot aisle of the data center.

As illustrated, the data center canopy 102 may include an exhaust inlet 104, a roof 106 opposite the exhaust inlet 104, and a floor comprising floor sections 108a, 108b. The exhaust inlet 104 may be bounded by the floor sections 108a, 108b and the roof 106 may be bounded by exhaust outlets 110a, 110b. The first exhaust outlet 110a may be disposed opposite the first floor section 108a. Similarly, the second exhaust outlet 110b may be disposed opposite the second floor section 108b. As illustrated, the exhaust outlets 108a, 108b may be oriented such that the exhaust flow is directed upwards away from the canopy 102.

The canopy 102 may include a first turning vane 112a to direct a first portion of an exhaust flow (depicted by the hashed lines) from the exhaust inlet 104 toward the first floor section 108a to be output by the first exhaust outlet 110a, and a second turning vane 112b to direct a second portion of the exhaust flow from the exhaust inlet 104 toward the second floor section 108b to be output by the second exhaust outlet 110b.

The turning vanes 112a, 112b may divert at least a portion of the exhaust flow away from the roof 106 so that the momentum forces of the exhaust flowing directly onto the roof 106 may be avoided or reduced as compared to configurations without turning vanes 112a, 112b. In addition to reducing pressure drop across the canopy 102, the reduction of force against the roof 106 may allow the roof 106 to be constructed using fewer reinforcements and/or with lighter or less sturdy material, which may result in the canopy 102 being cheaper in cost and/or easier to transport, install, or maintain.

In various examples, the turning vanes 112a, 112b may inhibit entry of precipitation into the exhaust inlet 104. In various ones of these examples, the turning vanes 112a, 112b may extending downwardly away from the roof 106 such that at least some of the precipitation that may enter the canopy 102 via the exhaust outlets 110a, 110b may be stopped from entering the exhaust inlet 104. In various examples, the turning vanes 112a, 112b may be configured such that precipitation may be directed towards the floor sections 108a, 108b.

Examples including turning vanes 112 to inhibit entry of precipitation into the exhaust inlet 104 may in turn permit the height of the roof 106 to be increased to allow for improved air flow through the canopy 102. Increasing the height of the roof 106 generally increases the spacing between the roof 106 and the exhaust inlet 104, which may result in a greater chance of precipitation entering the exhaust inlet 104, especially in cases of wind-driven precipitation. Including the turning vanes 112 as described herein, however, may help avoid the intrusion of precipitation into the exhaust inlet 104 even if the canopy 102 includes a roof 106 set a distance from the exhaust inlet 104.

FIGS. 2A-2D depict various views of an example data center canopy 202 in accordance with various examples. The data center canopy may 202 provide an exhaust passage for an exhaust flow from a data center. The canopy 202 may be mounted, for example, to a data center structure or may instead be an integrated part of the data center structure, to receive and then output an exhaust flow from a hot aisle of the data center.

As illustrated, the data center canopy 202 may include an exhaust inlet 204, a roof 206 opposite the exhaust inlet 204, and a floor comprising floor sections 208a, 208b. The exhaust inlet 204 may be bounded by the floor sections 208a, 208b and the roof 206 may be bounded by exhaust outlets 210a, 210b. The first exhaust outlet 210a may be disposed opposite the first floor section 208a. Similarly, the second exhaust outlet 210b may be disposed opposite the second floor section 208b. As illustrated, the exhaust outlets 210a, 210b may be oriented such that the exhaust flow is directed upwards away from the canopy 202.

Figure 2B:
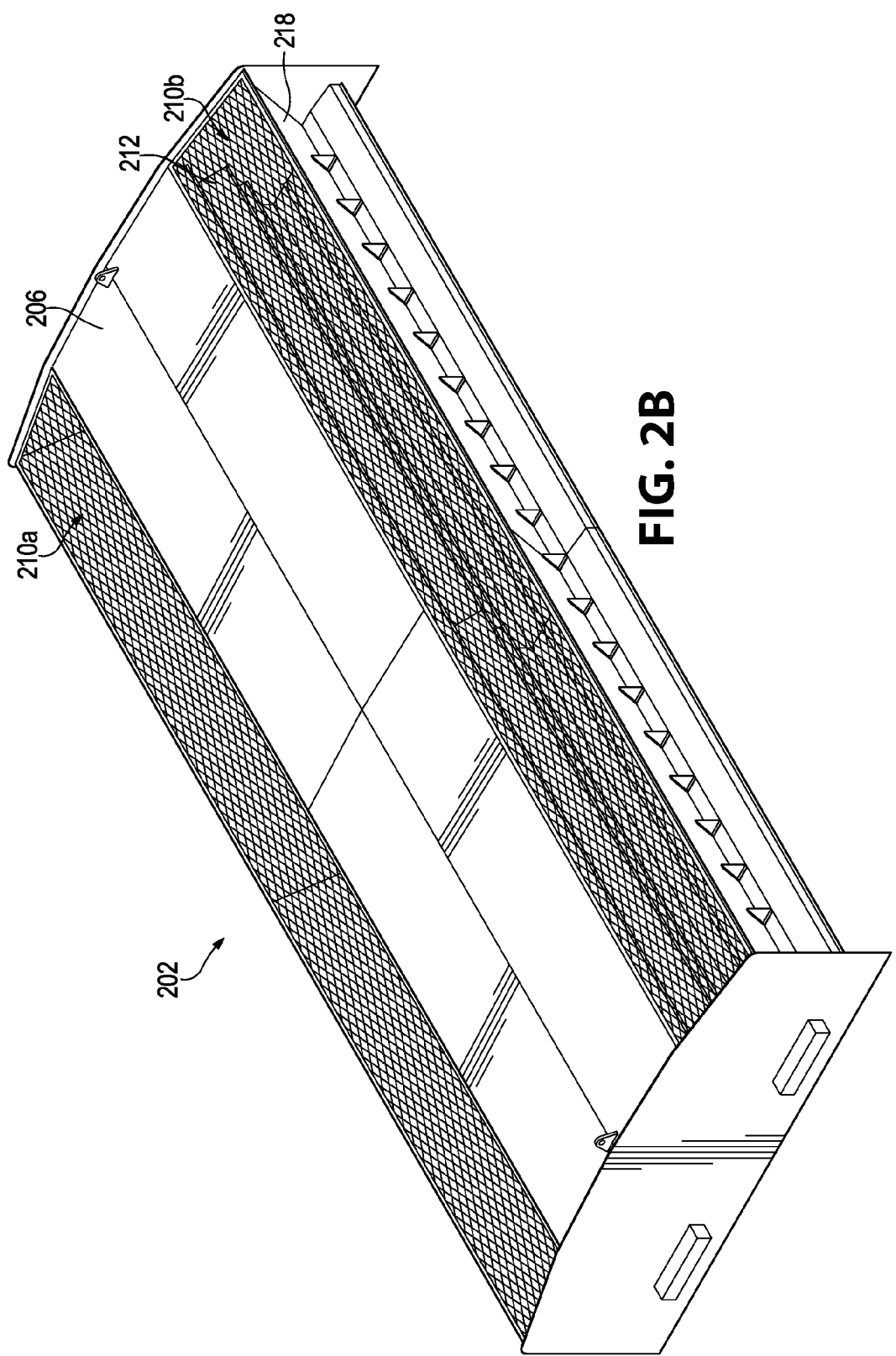

In various examples, the roof 206, exhaust outlets 210a, 210b, and the exhaust inlet 204 may extend longitudinally along at least part of the length of the canopy 202. As illustrated in FIG. 2B, for example, the roof 206 and the exhaust outlets 210a, 210b extend along substantially an entire length of the canopy 202. Likewise, as illustrated in FIG. 2C, the exhaust inlet 204 may extend along substantially an entire length of the canopy 202. In various other examples, at least one of the roof 206, exhaust outlets 210a, 210b, and the exhaust inlet 204 may extend along only part of the length of the canopy 202 (not illustrated).

Referring now generally to FIGS. 2A-2D, the canopy 202 may include at least one turning vane 212. At least one of the turning vanes 212 may extend longitudinally along at least part of a length of the canopy 202 or a length of the exhaust inlet 204. In some examples in which the exhaust inlet 204 extends longitudinally along less than the full length of the canopy 202, the turning vanes 212 may extend longitudinally along the length of the exhaust inlet 204. The turning vanes 212 may be stacked configuration, as illustrated, such that one of the turning vanes 212 is between another one of the turning vanes 212 and the roof 206.

At least one of the turning vanes 212 may include an elongate edge 212a extending over a floor section 208a or 208b and another elongate edge 212b extending over the exhaust inlet 204. As illustrated, for example, the canopy 202 includes two pairs of turning vanes 212, each turning vane 212 including a first elongate edge 212a extending over a floor section 208a or 208b and a second elongate edge 212b extending over the exhaust inlet 204.

The elongate edges 212a, 212b of the turning vanes 212 may facilitate turning an exhaust flow (depicted by the hashed lines of FIG. 2D) from the exhaust inlet 204 away from the roof 206 and toward the floor sections 208a, 208b so that the exhaust flow can be output from the canopy 202 via the exhaust outlets 210a, 210b, which may facilitate air flow through the canopy 202. To that end, the elongate edges 212a, 212b of the turning vanes 212 may generally extend in a direction away from the roof 206, as illustrated. Although in some examples an amount of the exhaust flow may still flow within the vicinity of the roof 206, the turning vanes 212 divert at least a portion of the exhaust flow away from the roof 206 so that the momentum forces of the exhaust flowing directly onto the roof 206 may be avoided or reduced as compared to configurations without turning vanes 212.

In addition to reducing pressure drop across the canopy 202, the reduction of force against the roof 206 may allow the roof 206 to be constructed using fewer reinforcements and/or with lighter or less sturdy material, which may result in the canopy 202 being cheaper in cost and/or easier to transport, install, or maintain.

In various examples, the canopy 202 may include a flow splitter 214 to direct the exhaust flow toward the exhaust outlets 210a, 210b, as illustrated. For any amount of exhaust flow not diverted by the turning vanes 212, the flow splitter 214 may facilitate turning the exhaust flow in a manner that reduces the force against the roof 206 as compared to configurations without the flow splitter 214. In various examples, the flow splitter 214 may be disposed adjacent to, without being directly coupled to, the roof 206. In other examples, the flow splitter 214 may be coupled to or integral to the roof 206.

In various examples, the floor sections 208a, 208b may each form a gutter for capturing precipitation that may enter the exhaust outlets 210a, 210b. Although some examples may include screens 216 extending across the exhaust outlets 210a, 210b for keeping out birds or debris, the exhaust outlets 210a, 210b are generally open to the ambient air so that the exhaust flow can be output from the canopy 202, with the screens 216 providing little barrier against entry of precipitation into the canopy 202. To capture precipitation (e.g., rain, snow, etc.), the floor sections 208a, 208b may be bounded by an exterior sidewall 218 and an interior sidewall 220 such that a gutter may be defined, at least in part, by the floor sections 208a, 208b and their respective exterior sidewall 218 and interior sidewall 220. The canopy 202 may include at least one drainage outlets 222 in the floor sections 208a, 208b for channeling precipitation away from the canopy 202.

In various examples, at least a portion of the exterior sidewalls 218 may be angled away from the roof 206, as illustrated. By angling the exterior sidewalls 218 away from the roof 206, the opening sizes of the exhaust outlets 210a, 210b may be increased, which may, in various examples, provide for improved air flow through the canopy 202.

In various examples, the turning vanes 212 may inhibit entry of precipitation into the exhaust inlet 204. As described herein, the turning vanes 212 may include an elongate edge 212a extending downwardly away from the roof 206. In this configuration, at least some of the precipitation that may enter the canopy 202 via the exhaust outlets 210a, 210b may be stopped from entering the exhaust inlet 204 by the elongate edge 212a. In various examples, the turning vanes 212 may be configured such that precipitation may run down the elongate edges 212a and then drip into gutters formed by the floor sections 208a, 208b and sidewalls 218, 220.

Examples including turning vanes 212 to inhibit entry of precipitation into the exhaust inlet 204 may in turn permit the height of the roof 206 to be increased to allow for improved air flow through the canopy 202. Increasing the height of the roof 206 generally increases the spacing between the roof 206 and the exhaust inlet 204, which may result in a greater chance of precipitation entering the exhaust inlet 204, especially in cases of wind-driven precipitation. Including the turning vanes 212 as described herein, however, may help avoid the intrusion of precipitation into the exhaust inlet 204 even if the canopy 202 includes a roof 206 set a distance from the exhaust inlet 204.

Although FIGS. 2A-2D depict an example of a canopy 202 including a flow splitter 214 and two pairs of turning vanes 212, various other configurations within the scope of the present disclosure may be possible. Some examples may not include the flow splitter 214 and/or may include fewer or more pairs of turning vanes 212. As illustrated in FIG. 3, a canopy 302 may include a single pair of turning vanes 312 and no flow splitter. In other examples, a canopy may include three or more pairs of turning vanes (not illustrated).

Additionally, although FIGS. 2A-2D and FIG. 3 depict examples of canopies including angular turning vanes, other configurations of turning vanes within the scope of the present disclosure may be possible. As illustrated in FIG. 4, for example, a canopy 402 may include turning vanes 412 having an arcuate shape. In still further examples, a turning vane may include more or fewer "faces." In the example illustrated in FIG. 2A-2D, the turning vanes 212 are each shaped with three faces (i.e., one face comprising the elongate edge 212a, one face comprising the elongate edge 212b, and one face between the elongate edges 212a, 212b). In other non-illustrated examples, however, a turning vane may include just two elongate edges with no intermediate face or may include more angles such that more than one face is between the elongate edges.

Data center canopies described herein may be incorporated into a data center housing to provide an exhaust passage for an exhaust flow from the data center. The data center canopy may be mounted to a data center housing or may instead be an integrated part of the data center housing, to receive and then output an exhaust flow from a hot aisle of the data center.

FIG. 5 illustrates an example data center 500, in accordance with various examples. The data center 500 may be a modular/containerized-style data center having a data center housing comprising an information technology (IT) module 524 and a cooling module 526. The cooling module 526 and the IT module 524 may be in stacked configuration as illustrated, with the cooling module 526 on top of the IT module 524. The data center housing may also comprise a canopy 502 similar to canopies described herein (such as, canopy 202 of FIGS. 2A-2D, canopy 302 of FIG. 3, or canopy 402 of FIG. 4). The canopy 502 may include, for example, at least one turning vane 512 and a flow splitter 514, to facilitate air flow through the canopy 502, and thus, through the data center 502. The canopy 502 may be an integral part of the cooling module 526 or may be a separate component coupled to the cooling module 526.

The IT module 524 may house at least one computer 528 including, but not limited to servers, various data storage devices, networking equipment, or other computing devices, although the present disclosure is not limited in this respect. In various examples, the computers 528 may comprise server racks.

The IT module 524 may comprise an interior space segregated or divided into cold and hot air aisles. The aisles 532, 534, 536 may be separated from one another by at least one computer 528. In various examples, aisles 532, 536 may be cold aisles and aisle 534 may be a hot aisle.

The data center 500 may be configured with an adaptive cooling system that allows the data center 500 to operate in different modes. Example modes may include, but are not limited to, direct expansion cooling mode, evaporative cooling mode, and economizer (air cooled) mode. In various examples, the data center 500 may include a cooling system capable of automatically adjusting the cooling mode based at least in part on ambient conditions. For example the data center 500 switch from economizer mode to direct expansion cooling mode, using direct expansion cooling units 544 and closing the data center 500 off from intaking ambient air, when the ambient air is too warm to provide the level of cooling desired, or from the direct expansion cooling mode to the economizer mode when the ambient air is suitable for cooling the computers 528. In some examples, ambient air may be mixed with air conditioned air from the direct expansion cooling units 544.

The path of the air flow through the data center 500 during an economizer mode operation is generally indicated by the hashed lines. As illustrated, the cooling module 526 may include at least one air inlet 530 to intake ambient air and provide the ambient air to aisles 532, 536 of the IT module 524 for cooling the computers 528. The IT module 524 may output the ambient air into a shared aisle 534 as an exhaust flow.

In various examples, the interior space 542 of the cooling module 526 may be in fluid communication with the aisle 534 and with the exhaust inlet 504 of the canopy 502, as illustrated. In this configuration, the exhaust flow from the IT module 524 may flow into an interior space 542 of the cooling module 526 and then to the exhaust inlet 504 of the canopy 502 to be output from the data center 500. As illustrated, the canopy 502 is oriented such that the exhaust flow is directed upwards away from the air inlets 530 and away from the direct expansion cooling units 544.

The data center 500 may include at least one blower 538, 540 for facilitating air flow through between the cooling module 526 and the IT module 524. The blower 538 may facilitate air flow from the cooling module 526 to the aisles 532, 536, and the blower 540 may facilitate air flow from the aisle 534 to the cooling module 526 as an exhaust flow, which may then be output from the data center via the canopy 502. Other examples may include more or fewer blowers than that illustrated.

As described herein, the canopy 502 may facilitate air flow and reduce pressure drop through the air exhaust path. The canopy 502 may include, for example, turning vanes 512, which may allow the canopy 502 to have an increased clearance while inhibiting entry of precipitation into the exhaust inlet 504. The reduction in pressure drop through the air exhaust path may allow for increased air flow throughput through the data center 500, without an increase in power consumption by the blowers 538, 540, which may increase the cooling capacity and efficiency of the data center 500.

Although certain examples have been illustrated and described herein, it will be appreciated by those of ordinary skill in the art that a wide variety of alternate and/or equivalent examples or implementations calculated to achieve the same purposes may be substituted for the examples shown and described without departing from the scope of this disclosure. Those with skill in the art will readily appreciate that examples may be implemented in a wide variety of ways. This application is intended to cover any adaptations or variations of the examples discussed herein. It is manifestly intended, therefore, that examples be limited only by the claims and the equivalents thereof.

What is claimed is:

1. A data center canopy comprising:
    a floor including an exhaust inlet bounded by a floor section;
    a roof opposite the exhaust inlet and bounded by an exhaust outlet opposite the floor section; and
    a turning vane to direct a portion of an exhaust flow from the exhaust inlet toward the floor section to be output by the exhaust outlet, wherein the turning vane includes a first elongate edge extending over the floor section and a second elongate edge extending over the exhaust inlet,
    wherein the turning vane comprises a plurality of stacked turning vanes that each comprise a different sized turning vane.

2. The canopy of claim 1, wherein the floor section is bounded by the exhaust inlet and a sidewall opposite the exhaust inlet, and wherein the first elongate edge of the turning vane extends away from the roof and toward the sidewall to inhibit entry of precipitation into the exhaust inlet.

3. The canopy of claim 1, wherein the turning vane extends longitudinally along at least part of a length of the exhaust inlet.

4. The canopy of claim 1, wherein the roof includes a flow splitter facing the exhaust inlet and extending along at least part of a length of the exhaust inlet, and wherein the flow splitter facilitates directing the portion of the exhaust flow toward the floor section.

5. The canopy of claim 1, further comprising an additional turning vane between the turning vane and the roof to facilitate directing the portion of the exhaust flow toward the floor section.

6. The canopy of claim 1, further comprising a screen spanning across the exhaust outlet.

7. The canopy of claim 1, further comprising: an exterior sidewall and an interior sidewall, adjacent the exhaust inlet, bounding the floor section, wherein the exterior sidewall, the first interior sidewall, and the floor section define a gutter.

8. The canopy of claim 7, wherein at least a portion of the exterior sidewall is angled away from the roof.

9. A data center canopy comprising:
    a floor including an exhaust inlet bounded by a floor section;
    a roof opposite the exhaust inlet and bounded by an exhaust outlet opposite the floor section;
    a first stack of turning vanes to direct a first portion of an exhaust flow from the exhaust inlet toward the floor section to be output by the exhaust outlet, wherein the first stack of turning vanes comprise a plurality of turning vanes, each comprising a different size, positioned between the floor section and the roof; and
    a second stack of turning vanes positioned between the first stack of turning vanes and the roof to direct a second portion of an exhaust flow from the exhaust inlet toward the floor section to be output by the exhaust outlet, wherein the first stack of turning vanes includes a first elongate edge extending over the floor section and a second elongate edge extending over the exhaust inlet and the second stack of turning vanes includes a third elongate edge extending over the first elongate edge of the first stack of turning vanes and a fourth elongate edge extending over the second elongate edge.

10. The canopy of claim 9, wherein the roof includes a flow splitter adjacent to the roof, and wherein the flow splitter facilitates directing the first portion of the exhaust flow toward the first floor section and to facilitate directing the second portion of the exhaust flow toward the second floor section.

11. The canopy of claim 9, wherein the roof includes an interior space in fluid communication with the exhaust inlet and with an interior space of the floor.

12. A data center comprising:
    a computer;
    an information technology (IT) module housing the computer;
    a cooling module to provide ambient air to the IT module for cooling the computer and receive an exhaust flow from the IT module; and
    a canopy to output the exhaust flow from the data center, the canopy including:
    an exhaust inlet bounded by a first floor section and a second floor section;

a roof opposite the exhaust inlet and bounded by a first exhaust outlet opposite the first floor section, and a second exhaust outlet opposite the second floor section;

a first stack of turning vanes to direct a first portion of the exhaust flow from the exhaust inlet toward the first floor section to be output by the first exhaust outlet, wherein the first stack of turning vanes comprise a plurality of turning vanes, each comprising a different size, positioned between the first floor section and the roof; and a second stack of turning vanes to direct a second portion of the exhaust flow from the exhaust inlet toward the second floor section to be output by the second exhaust outlet, wherein the second stack of turning vanes comprise a plurality of turning vanes, each comprising a different size, positioned between the second floor section and the roof.

13. The data center of claim 12, wherein the IT module includes a first aisle and a second aisle separated from the first aisle by the computer, wherein the cooling module provides the ambient air to the first aisle to cool the computer, and wherein the IT module outputs the ambient air into the second aisle as the exhaust flow.

14. The data center of claim 13, wherein:
the computer is a first computer and the data center further comprises a second computer housed by the IT module;
the IT module includes a third aisle separated from the second aisle by the second computer such that the second aisle is between the first computer and the second computer; and
the cooling module provides additional ambient air to the third aisle to cool the second computer.

* * * * *